United States Patent [19]

Kozuka

[11] Patent Number: 5,420,044
[45] Date of Patent: May 30, 1995

[54] METHOD FOR PRODUCING NON-MONOCRYSTALLINE SEMICONDUCTOR DEVICE

[75] Inventor: Hiraku Kozuka, Hiratsuka, Japan

[73] Assignee: Canon Kabushiki Kaisha, Tokyo, Japan

[21] Appl. No.: 212,918

[22] Filed: Mar. 15, 1994

Related U.S. Application Data

[62] Division of Ser. No. 886,048, May 20, 1992, Pat. No. 5,324,360.

[30] Foreign Application Priority Data

May 21, 1991 [JP] Japan ................................ 3-144173
Dec. 10, 1991 [JP] Japan ................................ 3-325800

[51] Int. Cl.6 ........................................... H01L 31/20
[52] U.S. Cl. ........................................ 437/4; 437/101;
     437/108; 437/109; 427/574; 427/578; 427/579
[58] Field of Search ............ 136/258 AM; 437/4, 101,
     437/105-106, 108-109; 427/578-579, 574;
     118/718, 719

[56] References Cited

U.S. PATENT DOCUMENTS

| | | | |
|---|---|---|---|
| 4,664,951 | 5/1987 | Doehler | 427/248.1 |
| 4,742,012 | 5/1988 | Matsomura et al. | 437/4 |
| 5,016,562 | 5/1991 | Madan et al. | 118/719 |
| 5,180,434 | 1/1993 | Didio et al. | 118/718 |

*Primary Examiner*—Aaron Weisstuch
*Attorney, Agent, or Firm*—Fitzpatrick, Cella, Harper & Scinto

[57] ABSTRACT

A method for producing a non-monocrystalline semiconductor device, such as amorphous silicon TFT, by forming at least two non-monocrystalline semiconductor films in successive manner on a substrate by plasma CVD, in which the film-growing surface and the interfaces of the formed films are constantly maintained in a plasma atmosphere until the end of film formation. In this manner the interface regions are protected from damage caused by the initial stage of plasma and eventual deposition of impurities in such regions. This is achieved, for example, by spreading the plasma area during the transfer of the substrate between the film-forming chambers.

7 Claims, 5 Drawing Sheets

METHOD FOR PRODUCING NON-MONOCRYSTALLINE SEMICONDUCTOR DEVICE

This application is a division of application Ser. No. 07/886,048, filed May 20, 1992, U.S. Pat. No. 5,324,360, issued Jun. 28, 1994.

BACKGROUND OF THE INVENTION

1. Field of the Invention

The present invention relates to a method for producing a non-monocrystalline semiconductor device adapted for use in a photoelectric converting device such as a solar cell, a line sensor or an area sensor, a thin film transistor (TFT) for the liquid crystal display or the like, more particularly a non-monocrystalline semiconductor device formed by successive laminations of plural thin semiconductor films, and an apparatus for executing the method.

2. Related Background Art

Non-monocrystalline thin semiconductor films, particularly those of non-monocrystalline silicon and compounds thereof, are frequently used in photoelectric converting devices of a large area such as a solar cell or line sensor, and in thin film transistors of liquid crystal displays, such thin films can be prepared at a low temperature and show strong light absorption in the visible region.

These devices, as exemplified by the solar cells, generally have laminated structure of two or more thin semiconductor films, such as a PIN structure, in order to attain their functions. For producing such devices, there is generally an apparatus employing a load-lock system in which films can be continuously formed without breaking the vacuum state after the substrate is loaded. Such load-lock apparatus is capable of forming different layers in independent vacuum chambers, and is effective in improving the device performance in terms of impurity reduction in each layer.

For producing the non-monocrystalline thin semiconductor film, there have been utilized various methods such as plasma CVD, photo CVD, thermal CVD, sputtering, and vacuum evaporation, but plasma CVD has principally been employed since it can provide a relatively high film quality and can easily provide a film of a large area. The plasma CVD consists of film deposition on a substrate by decomposing raw material gas(es) with a high frequency field or microwaves, thereby generating a deposition precursor. Among the plasma CVD methods, most popularly utilized is the capacitance-coupled high frequency plasma CVD method employing a high frequency power of 13.56 MHz as the excitation source.

FIG. 5 is a schematic view of a conventional capacitance-coupled high frequency plasma CVD apparatus of load-lock type employed for producing a PIN device.

The apparatus 500 is provided with a loading chamber 502; an N-type layer forming chamber 503 connected to said loading chamber 502 through a first gate valve 511; an I-type layer forming chamber 504 connected to said N-layer forming chamber 503 through a second gate valve 512; a P-type layer forming chamber 505 connected to said I-layer forming chamber 503 through a third gate valve 513; and an unloading chamber 506 connected to said P-layer forming chamber 505 through a fourth gate valve 514. Thus, said apparatus 500 is a multi-chamber system with five chambers in total, in which the N-layer forming chamber 503, the I-layer forming chamber 504, and the P-layer forming chamber 505, being mutually connected through the gate valves 512, 513, are independent in terms of vacuum level.

Said capacitance-coupled high frequency plasma CVD apparatus 500 is utilized in the following manner, in the preparation of a device with PIN structure.

At first a substrate 520 is set on a substrate holder 521, which is placed on rails 507 and loaded in the loading chamber 502. The interior of the loading chamber 502 is evacuated to a predetermined pressure, and the substrate 520 is heated to a predetermined temperature. Subsequently the substrate holder 521 is transferred into the N-layer forming chamber 503 by opening the first gate valve 511, which is thereafter closed.

Then the substrate 520 is heated to a predetermined temperature by a first heater (not shown) provided in the N-layer forming chamber 503. First raw material gas 525 is introduced into the N-layer forming chamber 503, and a first high frequency source 551 is turned on to apply a high frequency power to a first high frequency electrode 541, thereby generating plasma in the N-layer forming chamber 503 and effecting the formation of an N-layer. After the completion of film formation, said first high frequency source 551 is turned off, and the introduction of first raw material gas 525 into the N-layer forming chamber 503 is terminated.

Subsequently the interior of the N-layer forming chamber 503 is evacuated, and the substrate holder 521 is transferred to the I-layer forming chamber 504 by opening the second gate valve 512. Then an I-layer is formed with second raw material gas 526, in a procedure similar to that for N-layer formation. Then the interior of the I-layer forming chamber 504 is evacuated, and the substrate holder 521 is transferred to the P-layer forming chamber 505 by opening the third gate valve 513. A P-layer is formed with third raw material gas 527, in a procedure similar to that for N-layer formation. Then the interior of the P-layer forming chamber 505 is evacuated, and the substrate holder 521 is transferred to the unloading chamber 506 by opening the fourth gate valve 514. Finally, air is introduced into the unloading chamber 506, and the substrate holder 521 is taken out from said unloading chamber 506.

The N-, I-, and P-layers can be formed in succession on the substrate 520 in the above-explained manner. Other devices can also be formed in a similar manner by suitably varying the species of raw material gases and the number of film-forming chambers.

In the capacitance-coupled high frequency plasma CVD apparatus 500, electrically grounded first to third shields 531–533 are respectively provided around the first to third high frequency electrodes 541–543, for avoiding dispersion of discharge.

However, in the film formation utilizing the above-explained plasma CVD apparatus 500, the plasma has to be interrupted between successive film formations. The present inventors have found that this creates a plasma on/off hysteresis at the interface of the semiconductor layer, eventually affecting the device characteristics.

More specifically, such plasma CVD apparatus causes plasma damage on the interface by the initial plasma. The initial plasma means the plasma generated from the moment of activation of the excitation source to the stationary state, and induces a damage in the underlying film, thus generating defects in the interface.

Also the newly deposited film shows deteriorated interface characteristics, as the initially deposited part of said film, constituting the interface region, is formed by such initial plasma state. There are also reports that impurities such as oxygen, carbon, and nitrogen tend to deposit mainly at the interface, and such phenomenon results from the producing method explained above.

The device characteristics are significantly affected by such interface. For example, an amorphous silicon thin film transistor can be prepared by consecutive depositions in the order of an insulating film and an amorphous silicon film, or in the order of an amorphous silicon film and an insulating film, but the electrical properties and reliability of the device are considered generally superior in the former process. This is because the device characteristics are governed by the characteristics of the interface between the amorphous silicon and the insulating film, as the channel for the carriers is formed in a part of said amorphous silicon, close to said interface. More specifically, in the latter process, the device characteristics are deteriorated by the plasma damage induced in the surface of the amorphous silicon, constituting the channel of the thin film transistor, at the formation of insulating film on the amorphous silicon. However, even in the former process, the inherent film characteristics are not fully exploited because the channel is formed in the amorphous silicon deposited by the initial plasma.

Also in the photoelectric converting devices, the gain and the photoresponse are affected by the interface characteristics.

SUMMARY OF THE INVENTION

An object of the present invention is to provide a method for producing a non-monocrystalline semiconductor device with excellent interface characteristics, without inducing plasma damage to the interfaces of the laminated thin non-monocrystalline films, and an apparatus for executing said method.

Another object of the present invention is to provide a method for producing a semiconductor device of high performance, without undesirable influences of plasma damage or concentrated impurity deposition in the interfaces of semiconductor layers, and an apparatus for executing said method.

DETAILED DESCRIPTION OF THE PREFERRED EMBODIMENTS

Figure 1:
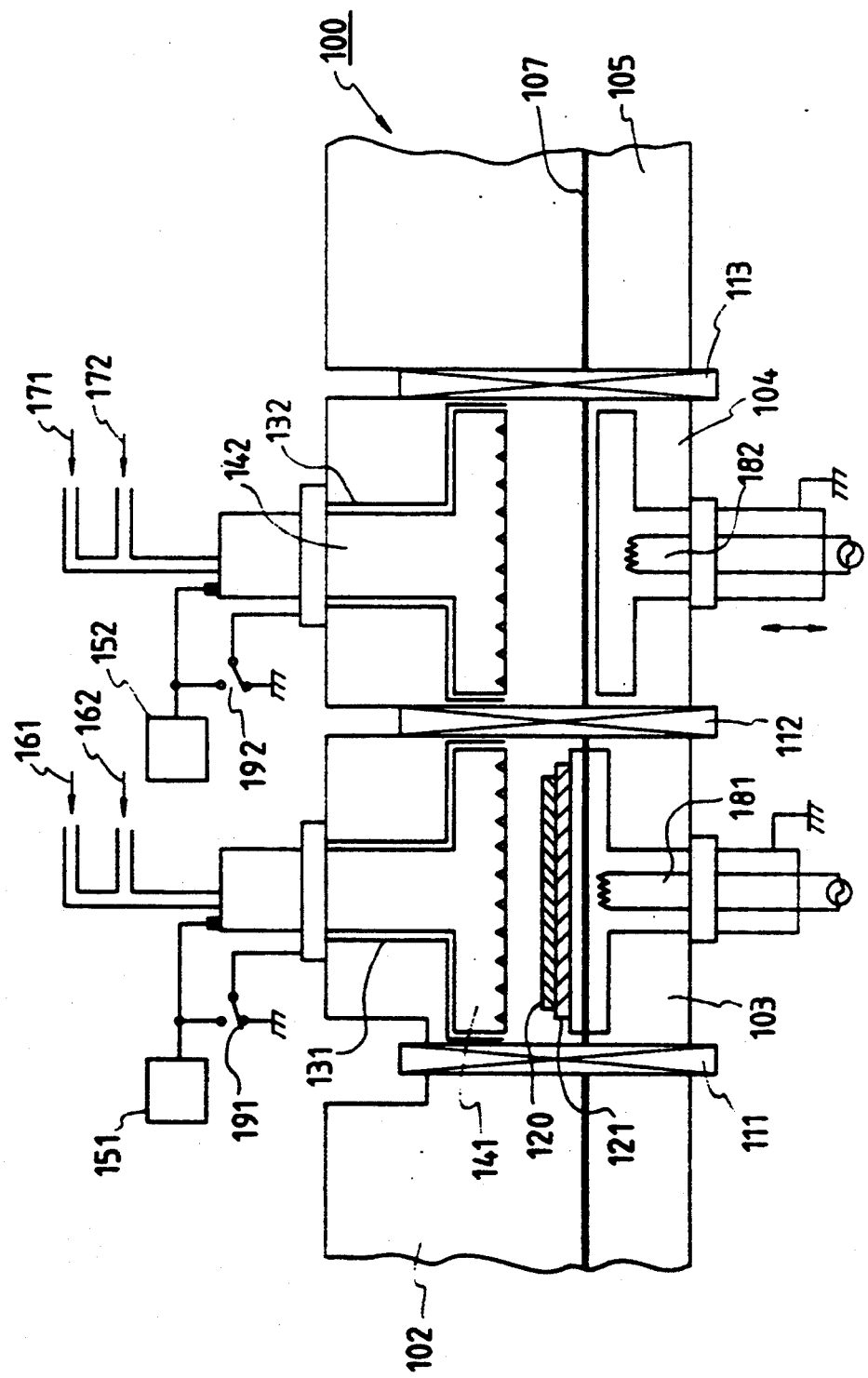
FIG. 1 is a schematic view of an example of the semiconductor device producing apparatus of the present invention.

In a preferred embodiment, the method of the present invention for producing a non-monocrystalline semiconductor device by forming at least two non-monocrystalline thin semiconductor films in succession by plasma CVD on a substrate, is characterized by the growing surface of the thin semiconductor film on the substrate and the interfaces of said thin films being constantly maintained in a plasma atmosphere until the successive film formations are completed.

Also, in another embodiment of the present invention, an apparatus is provided for producing a non-monocrystalline semiconductor device, including at least two independent film-forming chambers with respect to vacuum conditions and adapted for forming a non-monocrystalline semiconductor film on a substrate, comprising means for transferring said substrate, subjected to the formation of said non-monocrystalline semiconductor film in one of said film-forming chambers, to the other film-forming chamber while maintaining said substrate in a plasma atmosphere.

According to the present invention, in the case of formation of two or more semiconductor films in a consecutive manner, the substrate is always placed in a plasma atmosphere. Consequently, the growing surface of the film and the interfaces between films are constantly contacted with plasma, so that the damage by the initial plasma, resulting from the on/off action thereof, can be avoided.

The apparatus of the present invention is provided with a configuration capable of generating plasma not only in the film-forming areas but also in all the paths of transportation of the substrate.

In the present invention, the excitation source and method of plasma excitation can be selected depending on the apparatus, but are preferably the same as those used for film forming. The plasma excitation power except for film forming need not be constant, but may be varied, for example, by continuously varying the plasma excitation power during the transfer of the substrate to the next film formation process, thereby avoiding discontinuity in the plasma power.

In the present invention, since the plasma is continuously generated, the start and end of film formation can be achieved by changing the raw material gas. During film formation, therefore, the raw material gas is preferably used not singly but as a mixture with a diluting gas. With the use of such mixed gas, when the supply of the raw material gas is terminated after the completion of film formation, the discharge is maintained by the diluting gas so that the fluctuation in plasma can be suppressed. The diluting gas-can be hydrogen, argon or helium, but a preferred gas is principally composed of hydrogen.

For achieving stable and responsive supply of the raw material gas, the gas supply system may be divided into a path passing through the film-forming area and another path directly going to the discharge side without passing through the film-forming area, and the start and end of film formation may be controlled by changing said gas supply paths. In this case, the raw material gas is made to flow with a predetermined flow rate before the start of film formation, and the path of the raw material gas alone is changed at the start of film formation. This method is particularly effective in the case where the flow control device has a relatively slow response.

Thus, the present invention can prevent the drawbacks in the conventional method, namely deterioration in the characteristics of the semiconductor device resulting from plasma damage in the semiconductor interfaces and localized precipitation of impurities in the lamination of semiconductor films, thereby providing an improved semiconductor device of high performance.

In the following the present invention will be clarified in detail by embodiments thereof shown in the attached drawings.

Embodiment 1

FIG. 1 is a schematic view of a part of a capacitance-coupled high frequency plasma CVD apparatus of load-lock type, constituting an embodiment of the apparatus of the present invention for producing a non-monocrystalline semiconductor device.

The plasma CVD apparatus 100 shown in FIG. 1 is different from the conventional capacitance-coupled high frequency plasma CVD apparatus shown in FIG. 5, in the following points:

(1) A first high frequency electrode 141 in an N-layer forming chamber 103, a second high frequency electrode 142 in an I-layer forming chamber 104, and a third high frequency electrode (not shown) in a P-layer forming chamber 105 have a length approximately equal to the length of a glass substrate 120, in the transporting direction thereof, in said chambers 103, 104, 105. In the present invention, the length of the glass substrate, in the transporting direction thereof, is preferably 70% or more, more preferably 80% or more, of the length of the high frequency electrodes; and (2) First to third shields 131-133 (133 not being shown) provided respectively around the first to third high frequency electrodes 141-143 (143 not being shown) are provided with first to third switches 191-193 (193 not being shown) for connecting said shields to ground or to the high frequency potential.

In the following there will be explained, as an example, the process of forming a non-monocrystalline silicon PIN diode, with the above-explained plasma CVD apparatus 100.

A glass substrate 120, bearing a layer of evaporated chromium, was set on a substrate holder 121, which was placed on rails 107 and loaded into a loading chamber 102. Subsequently the interior of the loading chamber 102 was evacuated, and the glass substrate 120 was heated to a predetermined temperature. Then the substrate holder 121 was transferred to the N-layer forming chamber 103 by opening a first gate valve 111, which was subsequently closed. A first heater 181, serving also as an auxiliary electrode, was moved upwards to contact the substrate holder 121, and the glass substrate 120 placed thereon was heated to a predetermined temperature by said first heater 181.

Then first raw material gas 161, consisting of silane gas containing 1% of phosphine, and hydrogen gas 162 were introduced, with respective flow rates of 10 sccm and 40 sccm, into the N-layer forming chamber 103. The pressure therein was regulated to 0.5 Torr, and the first high frequency source 151 was turned on to initiate the formation of the N-layer. In this operation, the first shield 131 was electrically grounded by the first switch 191, in order that the plasma is concentrated between the glass substrate 120 and the first high frequency electrode 141. When the N-layer reached a predetermined thickness, the introduction of silane gas 161 into the N-layer chamber 103 was terminated, and hydrogen gas 172 was introduced with a flow rate of 40 sccm into the I-layer forming chamber 104 whereby the pressure therein was made same as that of the N-layer forming chamber 103. Then a second high frequency source 152 was turned on to generate hydrogen plasma between the second high frequency electrode 142 and a second heater 182 which serves also as an auxiliary electrode. While the second high frequency source was turned on, the second shield 132 was electrically grounded by the second switch 192. A second gate valve 112 was closed at this time, but the surface of the glass substrate 120 after N-layer formation was exposed to the hydrogen plasma because the hydrogen plasma was generated in the N-layer forming chamber 103 and in the I-layer forming chamber 104. Subsequently, the second gate valve 112 was opened, and the first and second shields 131, 132 were connected to the high frequency potential by the switches 191, 192, whereby the hydrogen plasma generated in the space between electrode 141 and the first heater 181, and that generated in the space between the second high frequency electrode 142 and the second heater 192 spread into the second gate valve 112.

Then, the substrate holder 121 was transferred to the I-layer forming chamber 104 while the second shield 132 was still grounded by the second switch 192. Thereafter the second heater 182 was moved upwards, the first high frequency source 151 was turned off, and the second gate valve 112 was closed. In this state the glass substrate 120 was exposed to the hydrogen plasma in the I-layer forming chamber 104. Subsequently, third gate valve 113 was opened and silane gas 171 was introduced into the I-layer forming chamber 104 to initiate the I-layer formation.

After the I-layer formation, a P-layer was formed in a similar manner, and the glass substrate 120 was taken out from an unloading chamber (not shown). Thereafter an indium tin oxide (ITO) film was formed on the glass substrate 120 by evaporation and patterned.

As explained above, the capacitance coupled high frequency plasma CVD apparatus 100 shown in FIG. 1 can constantly maintain the film growing surface of the glass substrate 120 and the interfaces between the N- and I-layers and between the I- and P-layers in a hydrogen plasma atmosphere, from the start of N-film formation to the end of P-layer formation.

Figure 5:
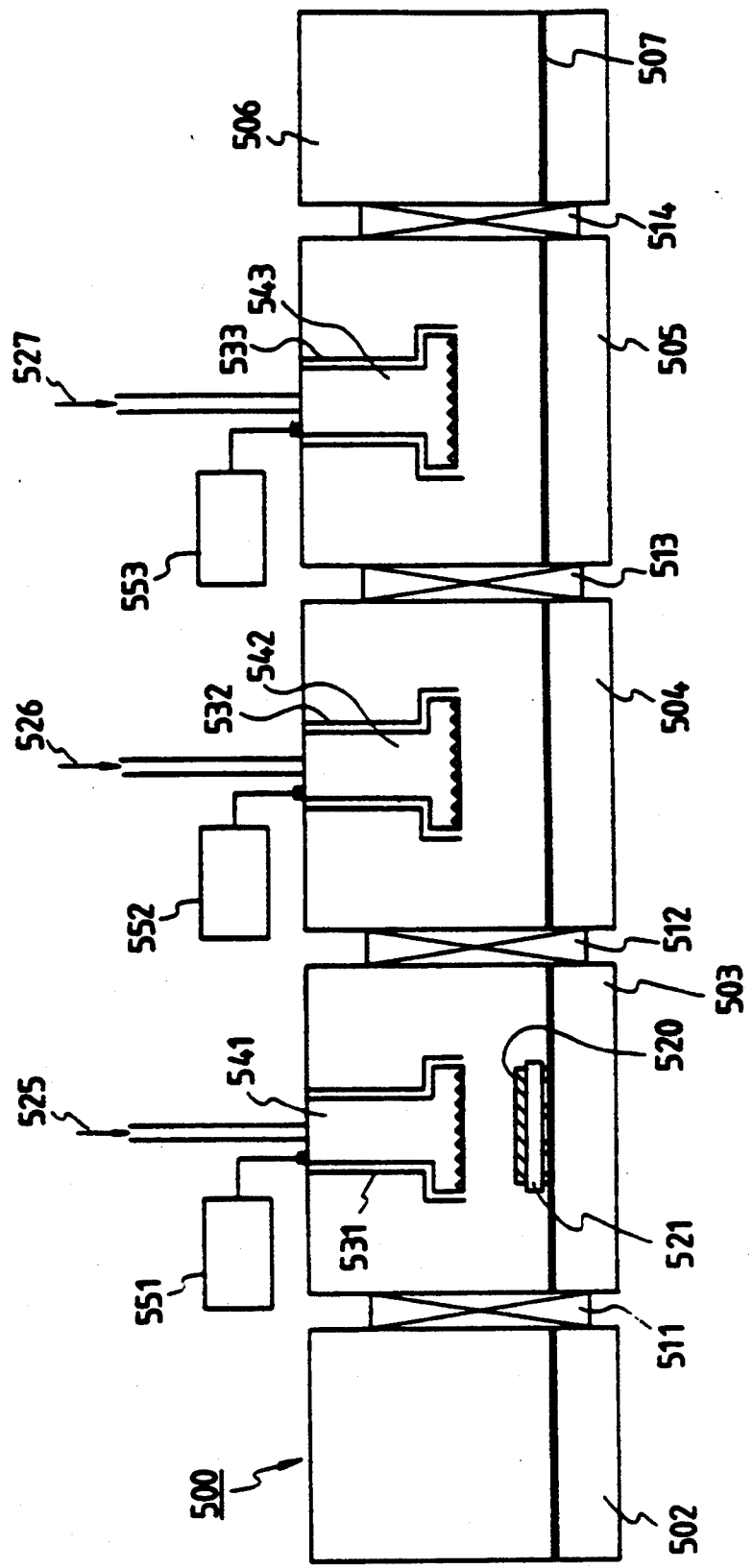
FIG. 5 is a schematic view of an example of the conventional plasma CVD apparatus.

For the purpose of comparison, a non-monocrystalline silicon PIN diode was prepared under similar conditions with the conventional capacitance-coupled high frequency plasma CVD apparatus 500 shown in FIG. 5, and the characteristics of both diodes were evaluated. As a result, the PIN diode prepared with the plasma CVD apparatus 100 of the present invention showed superior performance with respect to the reverse dark current and photoresponse, thus confirming the advantage of the present invention.

Embodiment 2

Figure 2:
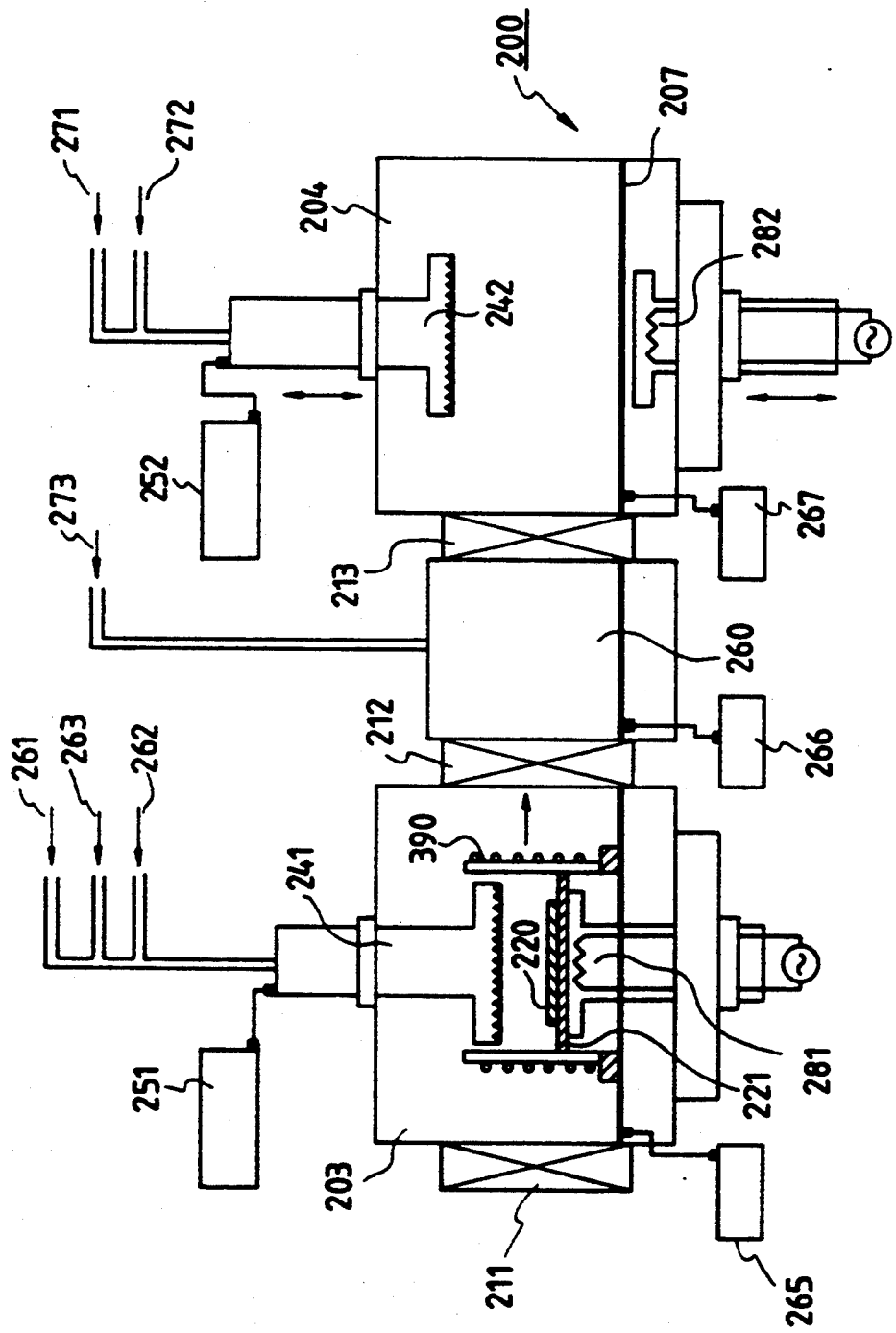
FIG. 2 is a schematic view of another example of the semiconductor device producing apparatus of the present invention.

FIG. 2 is schematic view of part of a capacitance-coupled high frequency plasma CVD apparatus 200, constituting another embodiment of the apparatus of the present invention for producing a non-monocrystalline semiconductor device.

Figure 3A:
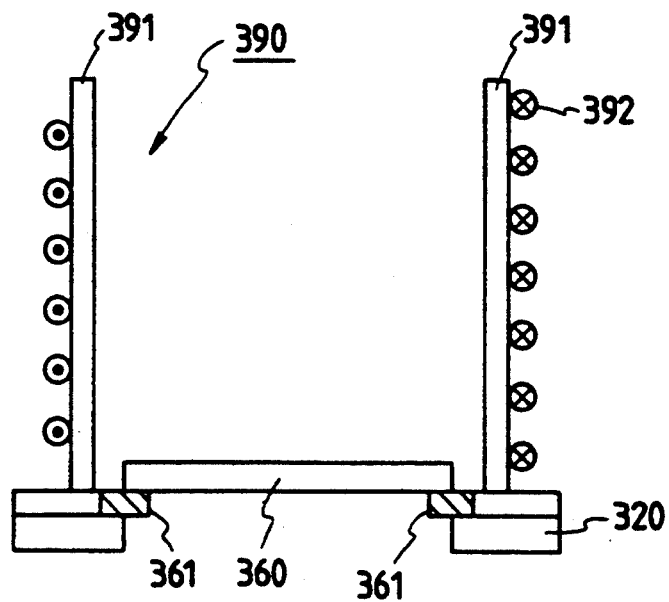
FIGS. 3A and 3B are schematic views of an example of a component adapted for use in the apparatus of the present invention.
Figure 3B:
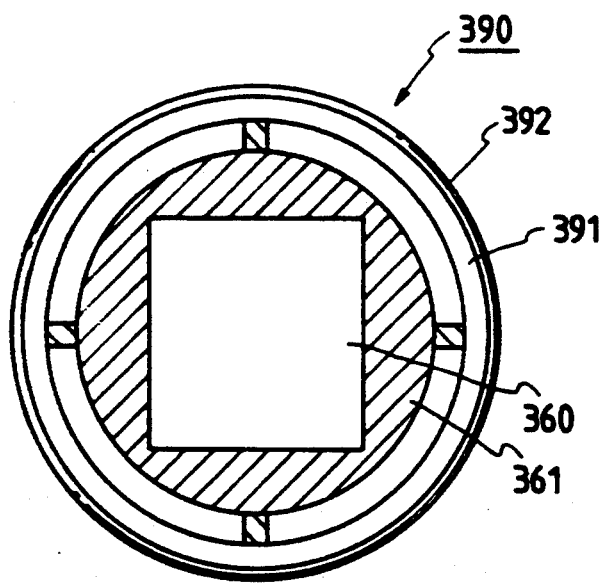

Said plasma CVD apparatus 200, designed for producing an amorphous silicon thin film transistor (TFT), is provided with a loading chamber (not shown), a silicon nitride film-forming chamber 203, an I-type amorphous silicon film-forming chamber 204, an N-type amorphous silicon film-forming chamber (not shown), and an unloading chamber (not shown), and is different from the conventional apparatus shown in FIG. 5, for producing a non-monocrystalline semiconductor device, in the following points:

(1) A substrate 220 is transported, together with a substrate holder 221, in an induction-coupled plasma container 390. As shown in FIGS. 3A and 3B, said container 390 is composed of a cylindrical glass container 391, around which a coil 392 is wound, and the substrate holder 361 for substrate 360 is set on an annular bottom 320 of said container 391. In such induction-coupled plasma container 390, plasma is generated inside the glass container 391, by the supply of high frequency electric power to said coil 392;

(2) Between the silicon nitride film-forming chamber 203 and the I-type amorphous silicon film-forming chamber 204, there is provided a first transfer tunnel 260 with a second gate valve 212 and third gate valve 213. Although not illustrated, a second transfer tunnel with fourth and fifth gate valves is provided between the I-type amorphous silicon film-forming chamber 204 and the N-type amorphous silicon film-forming chamber;

(3) The first to third electrodes 241, 242, 243 (243 not being shown) are vertically movable; and (4) The rails 207 are electrically interrupted between the silicon nitride film-forming chamber 203 and the first transfer tunnel 260, between the first transfer tunnel 260 and the I-type amorphous silicon film-forming chamber 204, between the I-type amorphous silicon film-forming chamber 204 and the second transfer tunnel (not shown), and between the second transfer tunnel and the N-type amorphous silicon film-forming chamber (not shown). Said rails 207 are connected to a first high frequency source 265 for coil 392 in the silicon nitride film-forming chamber 203, to a second high frequency source 266 for coil 392 in the first transfer tunnel 260, to a third high frequency source 267 for coil 392 in the I-type amorphous silicon film-forming chamber 204, to a fourth high frequency source (not shown) for coil 392 in the second transfer tunnel (not shown), and to a fifth high frequency source (not shown) for coil 392 in the N-type amorphous silicon film-forming chamber (not shown).

In the following there will be explained an example of the preparation of an amorphous silicon TFT with the above-explained capacitance-coupled high frequency plasma CVD apparatus 200.

A glass substrate 220, on which a chromium layer was deposited by evaporation and photolithographically patterned to form a gate electrode, was set on a substrate holder 221, and said holder 221 was placed in the plasma container 390. After said plasma container 390 was loaded in the loading chamber (not shown), the interior thereof was evacuated and the glass substrate was heated to a predetermined temperature. Then the first gate valve 211 was opened and the plasma container 390 was transferred to the silicon nitride film-forming chamber 203.

After the first gate valve 211 was closed, the first heater 281 was moved upwards through the aperture in the bottom 320 of the glass container 391, thereby moving the glass substrate 220 to a predetermined position, and said substrate 220 was heated to a predetermined temperature by the first heater 281. Then, the first high frequency electrode 241 was moved downwards to a predetermined position, and silane gas 261 and ammonia gas 263 as the raw material gases and hydrogen gas 262 as the diluting gas were introduced into the silicon nitride film-forming chamber 203. Next, the first high frequency source 251 was turned on to apply high frequency power to the first high frequency electrode 241, thereby forming a silicon nitride film on the glass substrate 220. Introduction of silane gas 261 and ammonia gas 263 into the silicon nitride film-forming chamber 203 was terminated when the silicon nitride film reached a predetermined thickness. In this state hydrogen gas 262 alone was introduced into said chamber 203, in which hydrogen plasma was generated by the high frequency power applied to the first high frequency electrode 241.

Then high frequency power was supplied to the coil 392 around the glass container 391, from the first high frequency source 265 through the rails 207, and the first high frequency source 251 was turned off to terminate the high frequency power supply to the first high frequency electrode 241. In this state, hydrogen plasma was generated in the glass container 391 by induction coupling. Thereafter the first high frequency electrode 241 and the first heater 281 were returned to their previous positions, and hydrogen gas 273 was introduced into the first transfer tunnel 260 at a pressure the same as that in the silicon nitride film-forming chamber 203. The plasma container 390 was transferred into the first transfer tunnel 260 by opening the second gate valve 212, which was subsequently closed. In this state, high frequency power was supplied to the coil 392 through the rails 207, from the second high frequency source 266, whereby hydrogen plasma could be maintained in the glass container 391 while it was positioned in the first transfer tunnel 260.

Then, hydrogen gas 272 was introduced into the I-type amorphous silicon film-forming chamber 204, and the pressure in the first transfer tunnel 260 was regulated to be the same as that in said chamber 204. The plasma container 390 was transferred to said chamber 204 by opening the third gate valve 213. After said gate valve 213 was closed, the second heater 282 was moved upwards through the aperture in the bottom 320 of the glass container 391 to move the glass substrate 220 to a predetermined position, and said substrate was heated to a predetermined temperature by the second heater 282. In this state, high frequency power was supplied from the third high frequency source 267 to the coil 392 through the rails 207, whereby hydrogen plasma was generated in the glass container 391.

Then the second high frequency electrode 242 was lowered to a predetermined position, the second high frequency source 252 was turned on, and the third high frequency source 267 was turned off. In this state, hydrogen plasma was generated in the glass container 391 by the high frequency power applied to the second high frequency electrode 252. Subsequently, silane gas 271, as the raw material gas, was introduced into the I-type amorphous silicon film-forming chamber 204, in addition to the hydrogen gas 272, thereby forming an I-type amorphous silicon film on the glass substrate 220. When said film reached a predetermined thickness, the supply of silane gas 271 alone into the I-type amorphous silicon film-forming chamber 204 was terminated.

Then an N-type amorphous silicon film was formed on the glass substrate 220 in a similar manner, and the glass substrate 220 was taken out from the unloading chamber. Then aluminum was deposited by evaporation and patterned on said substrate 220, whereby an amorphous silicon TFT was completed.

In the capacitance-coupled high frequency plasma CVD apparatus 200 explained above, the glass substrate 220 was constantly maintained in a plasma atmosphere, since the film formation onto said glass substrate was conducted in a capacitance-coupled plasma while the transfer of said substrate is conducted in an induction-coupled plasma. For this reason there was obtained an excellent semiconductor device, without deterioration of the characteristics at the interfaces of the deposited films.

Embodiment 3

Figure 4:
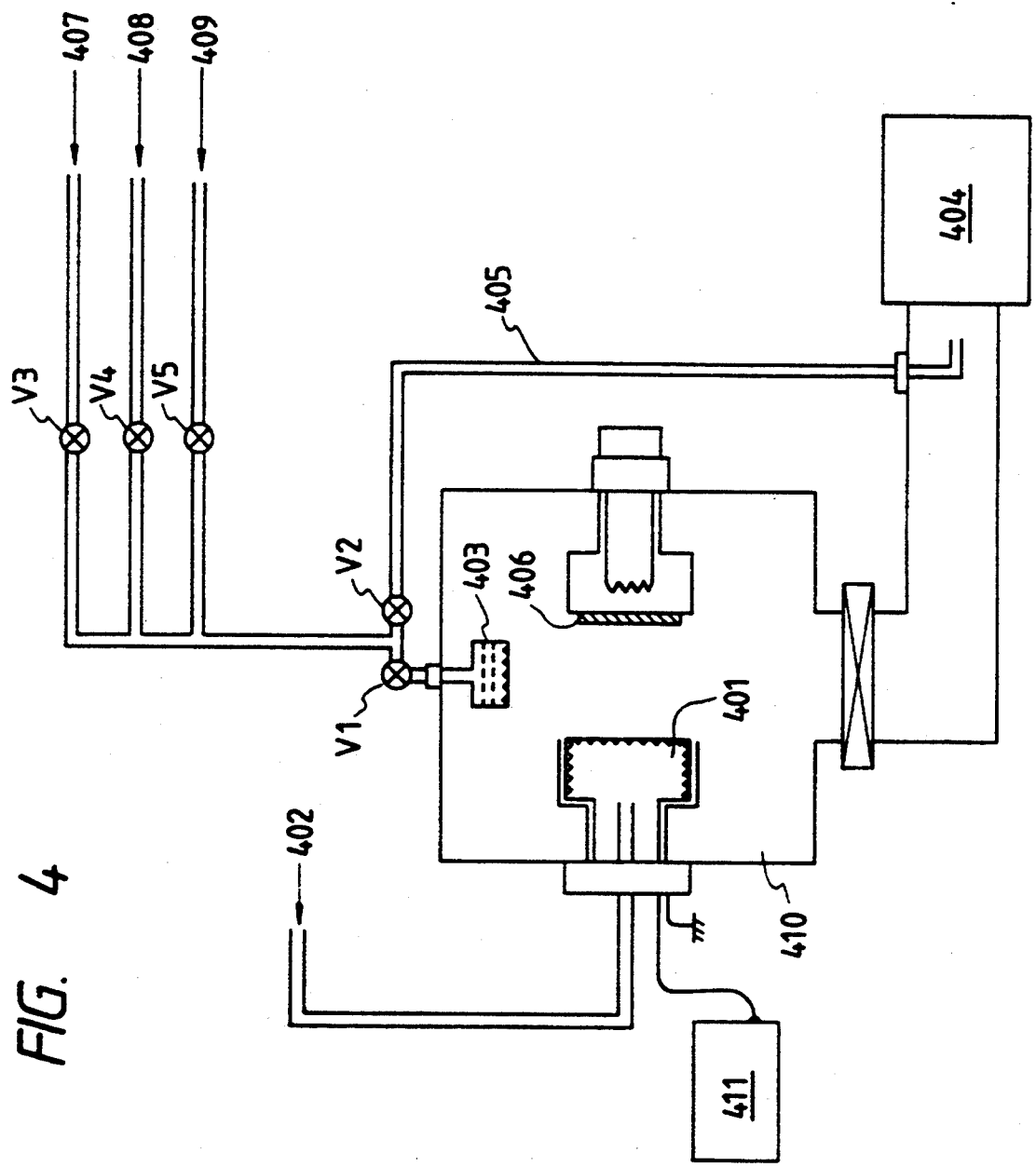
FIG. 4 is a schematic view of another example of the semiconductor device producing apparatus of the present invention.

In the following there will be explained another embodiment of the present invention illustrated in FIG. 4, in which film formations are conducted in a single chamber, and an amorphous silicon TFT is produced by gas changes. In the illustrated apparatus, hydrogen gas 402, containing 5% of helium gas, is supplied through a flat electrode 401, and raw material gases are supplied in the space between plasma electrodes. A buffer 403 is provided for improving the distribution of the raw material gases, but the presence of said buffer retards the response of start and end of supply of said raw material gases. Consequently a by-pass line 405 is provided for directly discharging the raw material gases by means of a vacuum pump 404, and the gas supply to the chamber 410 and the termination thereof are executed by simultaneous switching of valves V1 and V2 in such a manner that the valve V2 is automatically closed or opened when the valve V1 is respectively opened or closed.

First, a substrate 406, already bearing a patterned chromium layer as a gate metal, was loaded in the chamber, the chamber was evacuated and the substrate heated. Then valves V3, V4 and V1 were opened to introduce ammonia gas 407 and silane gas 408 as the raw material gases for silicon nitride, and hydrogen gas 402 into the chamber 410. Then a high frequency power source 411 was turned on to form a silicon nitride film, and, when a desired film thickness was reached, the valves V1, V2 were switched and the valves V3, V4 were closed to terminate the supply of the raw material gases. In this state only hydrogen gas 402 was supplied to the chamber 410 and the high frequency power 411 was still supplied, so that a hydrogen plasma was generated between the electrodes. Since the hydrogen flow rate and the high frequency power in the next amorphous silicon film formation were different from that in the silicon nitride film formation, the hydrogen flow rate was gradually varied with the adjustment of matching so as to reduce the amount of reflected high frequency power, and the high frequency power was then regulated to reach the film-forming conditions for the amorphous silicon. Subsequently the valve V4 was opened to introduce silane gas 408 into the bypass line 405, and, when the flow rate was stabilized, the valves V1, V2 were switched on to introduce silane gas into the chamber, thereby forming an amorphous silicon layer.

Such feeding method of raw materials gases enables gas supply with a relatively stable flow rate from the initial stage of film formation, even if high frequency plasma is continuously generated. When the amorphous silicon layer reached a desired thickness, the valves V1, V2 were switched to terminate the supply of silane gas 408 into the chamber 410. The silane gas was supplied to the bypass line 405, and the valve V5 was opened to also supply phosphine gas 409 diluted with hydrogen, as the doping gas, and flow rates were respectively regulated. When the flow rates were stabilized, the valves V1, V2 were again switched to introduce silane gas 408 and phosphine gas 409 into the chamber 410, thereby forming a doped layer. When the doped layer reached a desired thickness, the supply of high frequency power and all gases was terminated, and the substrate was taken out after cooling. Subsequently an aluminum layer was sputtered thereon and patterned, whereby an amorphous silicon TFT was completed.

What is claimed is:

1. A method for producing a non-monocrystalline semiconductor device by successively forming at least two kinds of non-monocrystalline semiconductor films on a substrate using a plasma CVD process, said method comprising a step of:
   conveying said substrate with a first semiconductor film formed thereon in a first film-forming chamber having a first non-initial plasma therein through a valve to a second film-forming chamber having a second non-initial plasma therein which is continuous with said non-initial plasma of said first film-forming chamber through said valve.

2. A method according to claim 1, wherein said non-initial plasma is maintained by using a diluting gas when forming a film.

3. A method according to claim 2, wherein said diluting gas is a gas selected from the group consisting of at least one of hydrogen, argon, and helium.

4. A method according to claim 1, wherein by switching a potential of first and second shields of said first and second chambers to a high frequency, the plasma spreads in said valve.

5. A method according to claim 1, wherein said non-initial plasma continuously varies in a conveyance direction of the substrate.

6. A method according to claim 1, wherein by switching between passing and non-passing of raw material gas through a film formation area, the commencement and termination of the formation of said semiconductor film on the substrate is controlled.

7. A method according to claim 1, wherein said non-initial plasma is formed by a high frequency plasma CVD process.

* * * * *

UNITED STATES PATENT AND TRADEMARK OFFICE
CERTIFICATE OF CORRECTION

PATENT NO.   : 5,420,044
DATED        : May 30, 1995
INVENTOR(S)  : Hiraku Kozuka It is certified that error appears in the above-identified patent and that said Letters Patent is hereby corrected as shown below:

Column 6,
Line 56, "is" should read -- is a --.

Column 8,
Line 52, "source 252" should read -- source 266 --; and
Line 56, "electrode 252." should read -- electrode 242. --.

Signed and Sealed this

Fourteenth Day of October, 2003

JAMES E. ROGAN
*Director of the United States Patent and Trademark Office*